United States Patent
Mayer et al.

(10) Patent No.: US 12,431,908 B2
(45) Date of Patent: Sep. 30, 2025

(54) ELECTRONIC DEVICES HAVING WIRELESS TRANSCEIVERS WITH REFERENCE CLOCK SELECTION

(71) Applicant: Apple Inc., Cupertino, CA (US)

(72) Inventors: Thomas Mayer, Linz (AT); Christian Wicpalek, Puchenau (AT); Juergen Koechl, Linz (AT); Jongmin Park, San Diego, CA (US)

(73) Assignee: Apple Inc., Cupertino, CA (US)

( * ) Notice: Subject to any disclaimer, the term of this patent is extended or adjusted under 35 U.S.C. 154(b) by 211 days.

(21) Appl. No.: 18/312,393

(22) Filed: May 4, 2023

(65) Prior Publication Data

US 2024/0372555 A1    Nov. 7, 2024

(51) Int. Cl.
| | |
|---|---|
| *H03L 7/093* | (2006.01) |
| *H03L 7/099* | (2006.01) |
| *H04B 1/30* | (2006.01) |

(52) U.S. Cl.
CPC ............ *H03L 7/093* (2013.01); *H03L 7/0996* (2013.01); *H04B 1/30* (2013.01); *H04B 2001/307* (2013.01)

(58) Field of Classification Search
CPC ......... H03L 7/093; H03L 7/0996; H03L 7/16; H04B 1/30; H04B 1/28; H04B 1/0475; H04B 2001/307; H04B 2001/0491
See application file for complete search history.

(56) References Cited

U.S. PATENT DOCUMENTS

| | | | |
|---|---|---|---|
| 5,856,766 A | 1/1999 | Gillig et al. | |
| 6,282,184 B1* | 8/2001 | Lehman | H04B 1/406 370/278 |
| 10,374,788 B2 | 8/2019 | Leipold et al. | |
| 2010/0093279 A1 | 4/2010 | Linsky et al. | |
| 2016/0043728 A1* | 2/2016 | Tourret | H03L 7/235 327/105 |
| 2019/0393916 A1* | 12/2019 | Mizutani | H04B 7/04 |
| 2022/0137236 A1 | 5/2022 | Conflitti et al. | |

* cited by examiner

*Primary Examiner* — Jeffrey M Shin
(74) *Attorney, Agent, or Firm* — Treyz Law Group, P.C.; Michael H. Lyons

(57) ABSTRACT

An electronic device may include wireless circuitry with first and second mixers on a signal path for converting a signal using first and second clock signals via high side injection (HSI) or low side injection (LSI). A first phase-locked loop (PLL) may generate the first clock signal and a second PLL may generate the second clock signal. A switch may couple the first PLL to a reference oscillator when LSI is used and may couple the first PLL to a third PLL when HSI is used. The third PLL may generate a second reference signal based on a first reference signal from the reference oscillator. The second PLL may generate the second clock signal based on the output of the third PLL. This may serve to may minimize phase noise even as the mixers switch between HSI and LSI.

20 Claims, 4 Drawing Sheets

HIS : $f_{RFLO} > f_{RF}$

LSI : $f_{RFLO} < f_{RF}$

ELECTRONIC DEVICES HAVING WIRELESS TRANSCEIVERS WITH REFERENCE CLOCK SELECTION

FIELD

This disclosure relates generally to electronic devices and, more particularly, to electronic devices with wireless communications circuitry.

BACKGROUND

Electronic devices are often provided with wireless communications capabilities. An electronic device with wireless communications capabilities has wireless communications circuitry with one or more antennas. The wireless communications circuitry can include mixers that convert signals between baseband and radio frequencies using clock signals.

If care is not taken, the clock signals can exhibit excessive phase noise that can be detrimental to transmission and reception using the wireless communications circuitry.

SUMMARY

An electronic device may include wireless circuitry for performing wireless communications. The wireless circuitry may include a transceiver, an antenna, and baseband circuitry. The transceiver may include a signal path that couples the baseband circuitry to the antenna. At least first and second mixers may be disposed on the signal path. The first mixer may convert a signal on the signal path between a baseband frequency and an intermediate frequency using a first clock signal. The second mixer may convert the signal between the intermediate frequency and a radio frequency using a second clock signal. The antenna may convey the signal at the radio frequency.

The mixer(s) may convert the signal using high side injection (HSI) or low side injection (LSI). The transceiver may include clocking circuitry that generates the first and second clock signals. The clocking circuitry may be switchable between an HSI mode and an LSI mode depending on the current injection mode of the mixer(s). The clocking circuitry may include a reference oscillator, a reference phase-locked loop (PLL), an intermediate frequency PLL, and a radio-frequency PLL. An input of the reference PLL may be coupled to an output of the reference oscillator. The output of the reference PLL may be coupled to the input of the radio-frequency PLL. A switch may couple the output of the reference oscillator and the output of the reference PLL to an input of the intermediate frequency PLL. An optional frequency divider may be coupled between the switch and the output of the reference PLL.

During operation, the reference oscillator may generate a first reference signal. The reference PLL may generate a second reference signal by upconverting the first reference signal. The radio frequency PLL may generate the second clock signal by upconverting the second reference signal. In the HSI mode, the second clock signal is at a higher frequency than the radio frequency of the signal conveyed by the antenna. In the LSI mode, the second clock signal is at a lower frequency than the radio frequency of the signal conveyed by the antenna. The switch may be toggled based on whether HSI or LSI is being used to convert the signal on the signal path.

In the HSI mode, the switch may couple the output of the reference PLL to the input of the intermediate frequency PLL. The intermediate frequency PLL may generate the first clock signal by upconverting the second reference signal. This may help to correlate the first clock signal with the second clock signal, which is also generated by upconverting the second reference signal (e.g., part of the clocks will be correlated and part of the phase noise injected by the first mixer will be canceled out by the second mixer). As such, the phase noise injected by the first mixer will be canceled out by the phase noise injected by the second mixer. In the LSI mode, the switch may couple the output of the reference oscillator to the input of the intermediate frequency PLL. The intermediate frequency PLL may generate the first clock signal by upconverting the first reference signal. This may decorrelate the first clock signal from the second clock signal, causing the mixers to inject less phase noise when using LSI than if the first and second clock signals were fully correlated.

An aspect of the disclosure provides an electronic device. The electronic device can include an antenna. The electronic device can include a first mixer communicably coupled to the antenna and configured to convert a signal between a first frequency and a second frequency based on a first clock signal. The electronic device can include a second mixer communicably coupled between the first mixer and the antenna and configured to convert the signal between the second frequency and a third frequency based on a second clock signal at a higher frequency than the first clock signal. The electronic device can include a reference oscillator. The electronic device can include a first phase-locked loop (PLL) having an input coupled to an output of the reference oscillator. The electronic device can include a second PLL having an input coupled to an output of the first PLL and configured to generate the second clock signal. The electronic device can include a third PLL configured to generate the first clock signal. The electronic device can include a switch having a first terminal coupled to the output of the reference oscillator, a second terminal coupled to the output of the first PLL, and a third terminal coupled to an input of the third PLL.

An aspect of the disclosure provides a wireless transceiver configured to convey a signal at a first frequency using an antenna. The wireless transceiver can include a first mixer configured to convert the signal between the first frequency and a second frequency lower than the first frequency. The wireless transceiver can include a second mixer configured to convert the signal between the second frequency and a third frequency lower than the second frequency. The wireless transceiver can include a first phase-locked loop (PLL) having an output coupled to the first mixer. The wireless transceiver can include a second PLL having an output coupled to the second mixer. The wireless transceiver can include a third PLL having an output coupled to an input of the first PLL. The wireless transceiver can include a switch coupled between the output of the third PLL and an input of the second PLL, the switch having a state that is based on an injection mode of the first mixer.

An aspect of the disclosure provides a method of operating an electronic device to wirelessly convey a signal. The method can include upconverting, using a first phase-locked loop (PLL), a first clock signal to produce a second clock signal. The method can include upconverting, using a second PLL, the second clock signal to produce a third clock signal. The method can include mixing, using a first mixer, the signal with the third clock signal, the third clock signal being higher in frequency than the signal. The method can include upconverting, using a third PLL, the second clock signal to produce a fourth clock signal lower in frequency than the third clock signal. The method can include mixing, using a second mixer, the signal with the fourth clock signal.

DETAILED DESCRIPTION

Figure 1:
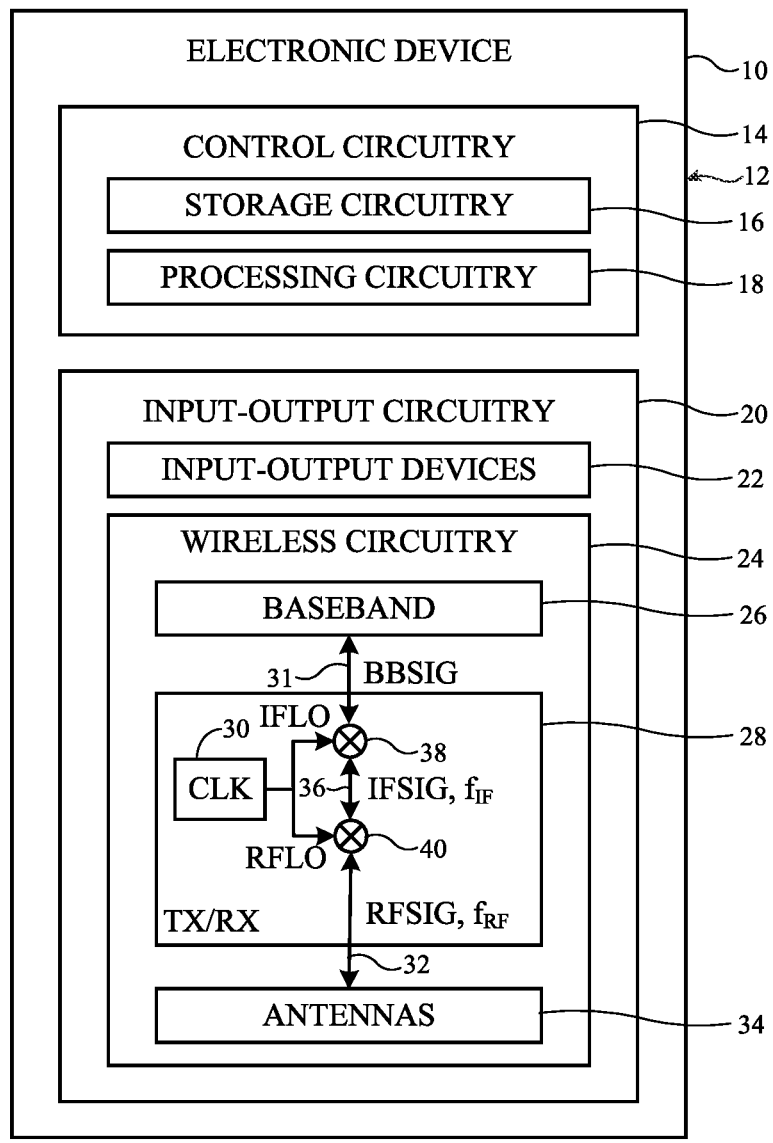
FIG. 1 is a schematic diagram of an illustrative electronic device having wireless circuitry in accordance with some embodiments.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the schematic diagram FIG. 1, device 10 may include components located on or within an electronic device housing such as housing 12. Housing 12, which may sometimes be referred to as a case, may be formed of plastic, glass, ceramics, fiber composites, metal (e.g., stainless steel, aluminum, metal alloys, etc.), other suitable materials, or a combination of these materials. In some situations, part or all of housing 12 may be formed from dielectric or other low-conductivity material (e.g., glass, ceramic, plastic, sapphire, etc.). In other situations, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more processors such as microprocessors, microcontrollers, digital signal processors, host processors, baseband processor integrated circuits, application specific integrated circuits, central processing units (CPUs), graphics processing units (GPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11ad protocols (e.g., ultra-wideband protocols), cellular telephone protocols (e.g., 3G protocols, 4G (LTE) protocols, 3GPP Fifth Generation (5G) New Radio (NR) protocols, Sixth Generation (6G) protocols, sub-THz protocols. THz protocols, etc.), antenna diversity protocols, satellite navigation system protocols (e.g., global positioning system (GPS) protocols, global navigation satellite system (GLONASS) protocols, etc.), antenna-based spatial ranging protocols, optical communications protocols, or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays, light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include baseband circuitry such as baseband circuitry 26 (e.g., one or more baseband processors and/or other circuitry that operates at baseband), radio-frequency (RF) transceiver circuitry such as transceiver (TX/RX) 28, radio-frequency front end circuitry (not shown), and one or more antennas 34. If desired, wireless circuitry 24 may include multiple antennas 34 that are arranged into a phased antenna array (sometimes referred to as a phased array antenna) that conveys radio-frequency signals within a corresponding signal beam that can be steered in different directions. Baseband circuitry 26 may be coupled to transceiver 28 over one or more baseband signal paths 31. Baseband circuitry 26 may include, for example, modulators (encoders) and demodulators (decoders) that operate on baseband signals. Transceiver 28 may be coupled to antennas 34 over one or more radio-frequency transmission line paths 32 (sometimes referred to herein as radio-frequency signal paths 32). Front end circuitry may be disposed on radio-frequency transmission line path(s) 32 between transceiver 28 and antennas 34 if desired.

In the example of FIG. 1, wireless circuitry 24 is illustrated as including only a single transceiver 28 and a single radio-frequency transmission line path 32 for the sake of clarity. In general, wireless circuitry 24 may include any desired number of transceivers 28, any desired number of radio-frequency transmission line paths 32, and any desired number of antennas 34. Each transceiver 28 may be coupled to one or more antennas 34 over respective radio-frequency transmission line paths 32.

Radio-frequency transmission line path 32 may be coupled to antenna feeds on one or more antennas 34. Each antenna feed may, for example, include a positive antenna feed terminal and a ground antenna feed terminal. Radio-frequency transmission line path 32 may have a positive transmission line signal path that is coupled to the positive antenna feed terminal and may have a ground transmission line signal path that is coupled to the ground antenna feed terminal. This example is merely illustrative and, in general, antennas 34 may be fed using any desired antenna feeding scheme.

Radio-frequency transmission line path 32 may include transmission lines that are used to route radio-frequency antenna signals within device 10. Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 32 may be integrated into rigid and/or flexible printed circuit boards. In one embodiment, radio-frequency transmission line paths such as radio-frequency transmission line path 32 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

In performing wireless transmission, baseband circuitry 26 may provide baseband signal BBSIG to transceiver 28 over baseband signal path(s) 31. Transceiver 28 (e.g., one or more transmitters in transceiver 28) may include circuitry for converting the baseband signals received from baseband circuitry 26 into corresponding radio-frequency signals. For example, transceiver 28 may include mixer circuitry for up-converting the baseband signals prior to transmission over antennas 34. Transceiver 28 may also include digital to analog converter (DAC) and/or analog to digital converter (ADC) circuitry (not shown) for converting signals between digital and analog domains. Transceiver 28 may transmit the signals (as radio-frequency signal RFSIG) over antennas 34 via radio-frequency transmission line path 32. Antennas 34 may transmit the radio-frequency signals to external wireless equipment by radiating the radio-frequency signals into free space.

In performing wireless reception, antennas 34 may receive radio-frequency signal RFSIG from the external wireless equipment. The received radio-frequency signals may be conveyed to transceiver 28 via radio-frequency transmission line path 32. Transceiver 28 may include circuitry for converting the received radio-frequency signals into corresponding baseband signals. For example, transceiver 28 may include one or more receivers having mixer circuitry for down-converting the received radio-frequency signals to baseband frequencies prior to conveying the baseband signals to baseband circuitry 26.

Front end circuitry (not shown) on radio-frequency transmission line path 32 may include radio-frequency front end components that operate on radio-frequency signals conveyed over radio-frequency transmission line path 32. If desired, the radio-frequency front end components may be formed within one or more radio-frequency front end modules (FEMs). Each FEM may include a common substrate such as a printed circuit board substrate for each of the radio-frequency front end components in the FEM. The radio-frequency front end components may include switching circuitry (e.g., one or more radio-frequency switches), radio-frequency filter circuitry (e.g., low pass filters, high pass filters, notch filters, band pass filters, multiplexing circuitry, duplexer circuitry, diplexer circuitry, triplexer circuitry, etc.), impedance matching circuitry (e.g., circuitry that helps to match the impedance of antennas 34 to the impedance of radio-frequency transmission line path 32), antenna tuning circuitry (e.g., networks of capacitors, resistors, inductors, and/or switches that adjust the frequency response of antennas 34), radio-frequency amplifier circuitry (e.g., power amplifier circuitry and/or low-noise amplifier circuitry), radio-frequency coupler circuitry, charge pump circuitry, power management circuitry, digital control and interface circuitry, and/or any other desired circuitry that operates on the radio-frequency signals transmitted and/or received by antennas 34.

While control circuitry 14 is shown separately from wireless circuitry 24 in the example of FIG. 1 for the sake of clarity, wireless circuitry 24 may include processing circuitry that forms a part of processing circuitry 18 and/or storage circuitry that forms a part of storage circuitry 16 of control circuitry 14 (e.g., portions of control circuitry 14 may be implemented on wireless circuitry 24). As an example, baseband circuitry 26 and/or portions of transceiver 28 (e.g., a host processor on transceiver 28) may form a part of control circuitry 14.

Wireless circuitry 24 may transmit and/or receive wireless signals (radio-frequency signal RFSIG) within corresponding frequency bands of the electromagnetic spectrum (sometimes referred to herein as communications bands or simply as "bands"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-100 GHz, near-field communications (NFC) frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Antennas 34 may be formed using any desired antenna structures. For example, antennas 34 may include antennas with resonating elements that are formed from loop antenna structures, patch antenna structures, inverted-F antenna structures, slot antenna structures, planar inverted-F antenna structures, helical antenna structures, monopole antennas, dipoles, hybrids of these designs, etc. Parasitic elements may be included in antennas 34 to adjust antenna performance.

Filter circuitry, switching circuitry, impedance matching circuitry, and other circuitry may be interposed within radio-frequency transmission line path 32, may be incorporated into front end circuitry, and/or may be incorporated into antennas 34 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antennas 34 over time.

In general, transceiver 28 may cover (handle) any suitable communications (frequency) bands of interest. The transceiver may convey radio-frequency signals using antennas 34 (e.g., antennas 34 may convey the radio-frequency signals for the transceiver circuitry). The term "convey radio-frequency signals" as used herein means the transmission and/or reception of the radio-frequency signals (e.g., for performing unidirectional and/or bidirectional wireless communications with external wireless communications equipment). Antennas 34 may transmit the radio-frequency signals by radiating the radio-frequency signals into free space (or to free space through intervening device structures such as a dielectric cover layer). Antennas 34 may additionally or alternatively receive the radio-frequency signals from free space (e.g., through intervening devices structures such as a dielectric cover layer). The transmission and reception of radio-frequency signals by antennas 34 each involve the excitation or resonance of antenna currents on an antenna resonating element in the antenna by the radio-frequency signals within the frequency band(s) of operation of the antennas.

In example where multiple antennas 34 are arranged in a phased antenna array, each antenna 34 may form a respective antenna element of the phased antenna array. Conveying radio-frequency signals using the phased antenna array may allow for greater peak signal gain relative to scenarios where individual antennas 34 are used to convey radio-frequency signals. In satellite navigation system links, cellular telephone links, and other long-range links, radio-frequency signals are typically used to convey data over thousands of feet or miles. In Wi-Fi® and Bluetooth® links at 2.4 and 5 GHz and other short-range wireless links, radio-frequency signals are typically used to convey data over tens or hundreds of feet. In scenarios where millimeter or centimeter wave frequencies are used to convey radio-frequency signals, a phased antenna array may convey radio-frequency signals over short distances that travel over a line-of-sight path. To enhance signal reception for millimeter and centimeter wave communications, the phased antenna array may convey radio-frequency signals using beam steering techniques (e.g., schemes in which antenna signal phase and/or magnitude for each antenna in an array are adjusted to perform beam steering).

For example, each antenna 34 in the phased antenna array may be coupled to a corresponding phase and magnitude controller. The phase and magnitude controllers may adjust the relative phases and/or magnitudes of the radio-frequency signals that are conveyed by each of the antennas 34 in the phased antenna array. The wireless signals that are transmitted or received by the phased antenna array in a particular direction may collectively form a corresponding signal beam. The signal beam may exhibit a peak gain that is oriented in a particular pointing direction at a corresponding pointing angle (e.g., based on constructive and destructive interference from the combination of signals from each antenna in the phased antenna array). Control circuitry 14 may adjust the phase and magnitude controllers to change the direction of the signal beam over time (e.g., to allow device 10 to continue to communicate with external equipment even if the external equipment moves relative to device 10 over time). This example is merely illustrative and, in general, antennas 34 need not be arranged in a phased antenna array.

If desired, transceiver circuitry 28 may include multiple stages of mixers for converting baseband signal BBSIG into radio-frequency signal RFSIG and vice versa (e.g., transceiver circuitry 28 may be a dual-stage conversion transceiver). For example, as shown in FIG. 1, transceiver 28 may include at least a first mixer 38 and a second mixer 40 communicably coupled between baseband signal path 31 and radio-frequency transmission line path 32. Mixer 38 may have a first input coupled to baseband signal path 31. The output of mixer 38 may be coupled to a first input of mixer 40 over intermediate frequency signal path 36. The output of mixer 40 may be coupled to radio-frequency transmission line path 32. Mixer 38 may sometimes be referred to herein as intermediate frequency mixer 38 whereas mixer 40 is sometimes referred to herein as radio-frequency mixer 40. Baseband data path 31, intermediate frequency signal path 36, and radio-frequency transmission line path 32 may sometimes be referred to herein collectively as the signal path for the corresponding antenna 34

(e.g., where the signal path conveys a signal that is converted between baseband, intermediate, and radio frequencies).

Transceiver circuitry 28 may also include clocking (CLK) circuitry such as clocking circuitry 30 (sometimes referred to herein as clock circuitry 30). Clocking circuitry 30 may generate one or more clock signals (e.g., local oscillator signals) that are used by transceiver circuitry 28 to transmit and/or receive signals over antenna(s) 34. The clock signals may, for example, include at least a first clock signal IFLO provided to a second input of mixer 38 and a second clock signal RFLO provided to a second input of mixer 40. Clock signal IFLO may be an intermediate frequency (IF) local oscillator (LO) signal and may therefore sometimes be referred to herein as intermediate frequency local oscillator signal IFLO or intermediate frequency oscillator signal IFLO. Clock signal RFLO may be a radio frequency (RF) local oscillator (LO) signal and may therefore sometimes be referred to herein as radio frequency local oscillator signal RFLO or radio frequency oscillator signal RFLO.

Clocking circuitry 30 may use clock signals IFLO and RFLO to clock mixers 38 and 40 in the transmission and reception of signals (wireless data). For example, during signal transmission, mixer 38 may generate intermediate frequency signal IFSIG based on clock signal IFLO and baseband signal BBSIG (e.g., mixer 38 may generate intermediate frequency signal IFSIG by mixing baseband signal BBSIG with clock signal IFLO). Mixer 38 may provide intermediate frequency signal IFSIG to the first input of mixer 40 over intermediate frequency signal path 36. Mixer 40 may generate radio-frequency signal RFSIG based on clock signal RFLO and intermediate frequency signal IFSIG (e.g., mixer 40 may generate radio-frequency signal RFSIG by mixing intermediate frequency signal IFSIG with clock signal RFLO). While referred to herein as RFSIG, IFSIG, and BBSIG, radio-frequency signal RFSIG, intermediate frequency signal IFSIG, and baseband signal BBSIG are all versions of the same signal (e.g., conveying the same wireless data) but at different frequencies (e.g., as converted using mixers 38 and 40).

Conversely, during signal reception, mixer 40 may receive radio-frequency signal RFSIG over radio-frequency transmission line path 32 (e.g., the output of mixer 40 during signal transmission may form the first input of mixer 40 during signal reception). Mixer 40 may generate intermediate frequency signal IFSIG based on clock signal RFLO and radio-frequency signal RFSIG (e.g., mixer 40 may generate intermediate frequency signal IFSIG by mixing radio-frequency signal RFSIG with clock signal RFLO). Mixer 40 may provide intermediate frequency signal IFSIG to mixer 38 over intermediate frequency signal path 36 (e.g., the output of mixer 38 during signal transmission may form the first input of mixer 38 during signal reception). Mixer 38 may generate baseband signal BBSIG based on clock signal IFLO and intermediate frequency signal IFSIG (e.g., mixer 38 may generate baseband signal BBSIG by mixing intermediate frequency signal IFSIG with clock signal IFLO). Mixer 38 may pass baseband signal BBSIG to baseband circuitry 26 over baseband signal path 31.

Radio-frequency signal RFSIG may be at the frequency $f_{RF}$ used by antenna(s) 34 (e.g., a resonant frequency of the antenna(s)). Frequency $f_{RF}$ may, for example, be a millimeter or centimeter wave frequency between around 10 GHz and 100 GHz. Frequency $f_{RF}$ may sometimes be referred to herein as radio frequency $f_{RF}$. Intermediate frequency signal IFSIG may be at a frequency $f_{IF}$ (sometimes referred to herein as intermediate frequency $f_{IF}$) that is lower than radio frequency $f_{RF}$ and higher than the frequency of baseband signal BBSIG. Performing two stages of frequency conversion using mixers 38 and 40 may serve to minimize signal attenuation associated with the propagation of radio-frequency signal RFSIG along radio-frequency transmission line path 32 (particularly at relatively high frequencies subject to relatively high attenuation such as millimeter/centimeter wave frequencies) and may help to minimize the complexity of the circuit components of transceiver 28, for example.

If desired, mixers 38 and 40 may support multiple injection modes such as both low side injection (LSI) and high side injection (HSI). In these implementations, when $f_{RF}$ is greater than the frequency of clock signal RFLO, LSI is used. Conversely, when $f_{RF}$ is less than the frequency of clock signal RFLO, HSI is used.

Clocking circuitry 30 may be switchable between a first state/mode in which the clock signals generated by clocking circuitry 30 are provided to the corresponding mixers for performing frequency conversion using HSI (sometimes referred to herein as an HSI mode or state) and a second state/mode in which the clock signals are provided to the corresponding mixers for performing frequency conversion using LSI (sometimes referred to herein as an LSI mode or state). Mixers 38 and 40 may sometimes be referred to herein as being in an HSI mode or state when performing frequency conversion using HSI and may sometimes be referred to herein as being in an LSI mode or state when performing frequency conversion using LSI. Control circuitry 14 may provide control signals to clocking circuitry 30 to switch clocking circuitry 30 between the LSI and HSI modes.

Figure 2:
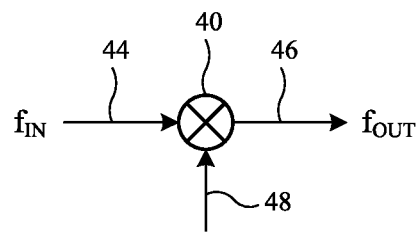
FIG. 2 is a circuit diagram of an illustrative mixer that mixes an input signal with a clock signal in a high side injection mode or a low side injection mode in accordance with some embodiments.

FIG. 2 is a circuit diagram showing how mixer 40 may perform frequency conversion using HSI or LSI. As shown in FIG. 2, mixer 40 may have a first input 44, a second input 48 (sometimes referred to herein as clock input 48) and an output 46. Input 44 may be coupled to radio-frequency transmission line path 32 (FIG. 1) during signal reception and may be coupled to intermediate frequency signal path 36 (FIG. 1) during signal transmission. Output 46 may be coupled to radio-frequency transmission line path 32 (FIG. 1) during signal transmission and may be coupled to intermediate frequency signal path 36 (FIG. 1) during signal reception.

During frequency conversion, mixer 40 may receive an input signal at input frequency $f_{IN}$ over input 44. The input signal may be intermediate frequency signal IFSIG during signal transmission (where $f_{IN}=f_{IF}$ of FIG. 1). The input signal may be radio frequency signal RFSIG during signal reception (where $f_{IN}=f_{RF}$ of FIG. 1). Mixer 40 may receive clock signal RFLO at input 48. Clock signal RFLO may be at clock frequency $f_{RFLO}$. Mixer 40 may generate an output signal at output 46 by mixing the input signal with clock signal RFLO. The output signal may be at output frequency $f_{OUT}$. During signal transmission, the output signal is radio frequency signal RFSIG and $f_{OUT}=f_{RF}$. During signal reception, the output signal is intermediate frequency signal IFSIG and $f_{OUT}=f_{IF}$.

Generally, if the clock signal is greater or less than the radio frequency will determine whether HSI or LSI is used, where the radio frequency ($f_{RF}$) can be either the frequency of the input signal or output signal depending on mixer direction (e.g., signal transmission or reception, where LSI involves the clock signal frequency being less than the radio frequency and HSI involves the clock signal frequency being greater than the radio frequency). If desired, filter circuitry (not shown) may be used to remove one of the frequencies prior to passing the output signal to the next component of the signal path. While FIG. 2 shows the operation of mixer 40 for the sake of illustration, mixer 38 (FIG. 1) may be similarly operated in HSI or LSI modes if desired.

Devices with millimeter/centimeter wave signaling capabilities such as device 10 can be very sensitive to phase noise in clock signals (e.g., because the clocking circuitry consumes a relatively high amount of power and chip area for millimeter/centimeter wave frequencies). Transceivers with dual stage frequency conversion such as transceiver 28 can be particularly sensitive to phase noise in clock signals because, if care is not taken, the phase noise introduced by the first mixer (e.g., mixer 38) can undesirably add with the phase noise introduced by the second mixer (e.g., mixer 40). Care should also be taken to dynamically adapt the clocking circuitry to minimize phase noise even when the clocking circuitry switches between HSI and LSI modes.

Figure 3:
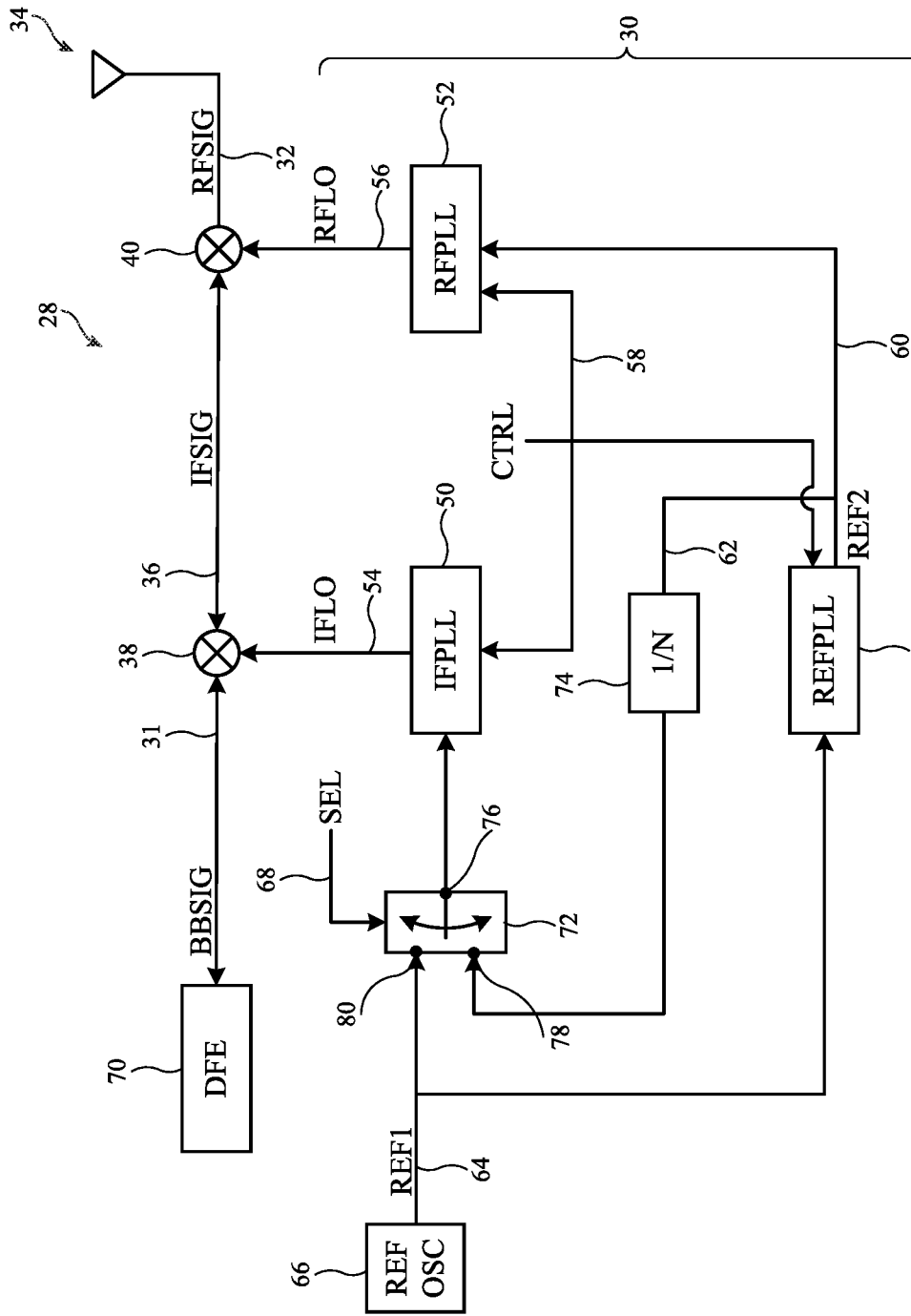
FIG. 3 is a circuit diagram of illustrative clocking circuitry that provides clock signals to mixers in a high side injection mode or a low side injection mode in accordance with some embodiments.

Clocking circuitry 30 (FIG. 1) may therefore be provided with circuitry that serves to minimize phase noise in the clocking signals provided to mixers 38 and 40 across both HSI and LSI modes. FIG. 3 is a circuit diagram of clocking circuitry 30.

As shown in FIG. 3, clocking circuitry 30 may provide clock signal IFLO to the clock input of mixer 38 over clock path 54 (sometimes referred to herein as LO path 54, IF clock path 54, or IF LO path 54). Clocking circuitry 30 may also provide clock signal RFLO to the clock input of mixer 40 over clock path 56 (sometimes referred to herein as LO path 56, RF clock path 56, or RF LO path 56). During signal reception, mixer 38 may transmit baseband signal BBSIG to digital front end (DFE) 70 (e.g., in baseband circuitry 26 of FIG. 1) over baseband signal path 31. During signal transmission, mixer 38 may receive baseband signal BBSIG from DFE 70 over baseband signal path 31.

Clocking circuitry 30 may include multiple phase locked loops (PLLs) such as a reference PLL (REFPLL) 82, an intermediate frequency PLL (IFPLL) 50, and a radio-frequency PLL (RFPLL) 52. PLLs 82, 50, and 52 may sometimes also be referred to herein as PLL circuits 82, 50, and 52. Each PLL may include a respective loop path, phase detector or comparator, loop filter, multiplier, and/or any other desired PLL circuitry for generating a respective output signal based on a corresponding input signal (e.g., where the output signal is phase-locked to the input signal or otherwise exhibits a phase related to that of the input signal). The output of IFPLL 50 may be coupled to the clock input of mixer 38 over clock path 54. The output of RFPLL 52 may be coupled to the clock input of mixer 40 over clock path 56. The output of REFPLL 82 may be coupled to the input of RFPLL 52 over path 60.

Clocking circuitry 30 may include a reference oscillator such as reference oscillator (REF OSC) 66. Reference oscillator 66 may include a crystal oscillator, a micro-electro-mechanical systems (MEMS)-based oscillator, or any other desired oscillator that generates an oscillator signal such as reference signal REF1 that is stable in frequency (e.g., across a wide range of operating temperatures). Reference oscillator 66 may generate reference signal REF1 at a relatively low frequency such as a frequency between 10-100 MHz, for example. Reference signal REF1 may sometimes also be referred to herein as an oscillator signal, a local oscillator signal, or a clock signal.

Clocking circuitry 30 may include a switching circuit such as switch 72 coupled between reference oscillator 66, the input of IFPLL 50, and the output of REFPLL 82. Switch 72 may have an output terminal 76 coupled to the input of IFPLL 50. Switch 72 may have a first input terminal 80 and a second input terminal 78. The output of REFPLL 82 may be coupled to input terminal 78 of switch 72 over path 62. If desired, a divider circuit such as divider 74 may be disposed on path 62 between input terminal 78 and the output of REFPLL 82. The output of reference oscillator 66 may be coupled to input terminal 80 of switch 72 and to the input of REFPLL 82 over path 64.

Switch 72 may be switchable between at least a first switch state and a second switch state. Switch 72 may be, for example, a single pole double throw (SPDT) switch. Switch 72 may have a control input 68 that receives a switch selection control signal SEL (e.g., from control circuitry 14 of FIG. 1). Control signal SEL may toggle switch 72 between the first switch state and the second switch state. Control signal SEL may, for example, be a digital control signal having a first logic value (e.g., binary "0") that sets switch 72 in the first switch state and a second logic value (e.g., binary "1") that sets switch 72 in the second switch state.

In the first switch state, input terminal 80 of switch 72 is coupled to output terminal 76 (e.g., switch 72 forms a short circuit at the frequency of reference signal REF1 between input terminal 80 and output terminal 76 and forms an open circuit at the frequency of reference signal REF1 between input terminal 78 and output terminal 76). This may serve to couple the output of reference oscillator 66 to the input of IFPLL 50 and decouples the output of REFPLL 82 from the input of IFPLL 50.

In the second switch state, input terminal 78 of switch 72 is coupled to output terminal 76 (e.g., switch 72 forms a short circuit at the frequency of reference signal REF1 between input terminal 78 and output terminal 76 and forms an open circuit between input terminal 80 and output terminal 76). This may serve to couple the output of REFPLL 82 to the input of IFPLL 50 and decouples the output of reference oscillator 66 from the input of IFPLL 50.

During signal transmission or reception, REFPLL 82 may generate a reference signal REF2 based on the reference signal REF1 generated by reference oscillator 66. REFPLL 82 may, for example, upconvert (multiply) reference signal REF1 to a higher frequency (e.g., between around 100 MHz and 10 GHz) that is closer to the frequency of the clock signal RFLO to be generated by RFPLL 52. REFPLL 82 may transmit reference signal REF2 to the input of RFPLL 52 over path 60. REFPLL 82 may concurrently transmit reference signal REF2 to input terminal 78 of switch 72 over path 62. Reference signal REF2 may sometimes also be referred to herein as an oscillator signal, a local oscillator signal, or a clock signal.

RFPLL 52 may generate clock signal RFLO based on reference signal REF2. RFPLL 52 may, for example, upconvert (multiply) reference signal REF2 up to the frequency of clock signal RFLO (e.g., frequency $f_{RFLO}$ of FIG. 2) and may output the upconverted reference signal as clock signal RFLO. As frequency $f_{RFLO}$ is relatively high (e.g., when radio-frequency signal RFSIG is at a millimeter/centimeter wave frequency), using REFPLL 82 to first convert reference signal REF1 to a frequency between the frequency of reference signal REF1 and frequency $f_{RFLO}$ may serve to reduce phase noise relative to implementations where RFPLL 52 upconverts reference signal REF1 from reference oscillator 66 directly.

If desired, divider 74 may divide the reference signal REF2 provided to input terminal 78 of switch 72 to reduce the frequency of reference signal REF2 to a frequency more suitable for the circuitry of IFPLL 50. Divider 74 may be omitted in implementations where IFPLL 50 includes circuitry that is able to generate clock signal IFLO using the relatively high frequency of reference signal REF2. Divider 74 may sometimes be referred to herein as frequency divider 74.

When switch 72 is in the first switch state (e.g., when input terminal 80 is coupled to output terminal 76), IFPLL 50 may generate clock signal IFLO based on the reference signal REF1 output by reference oscillator 66. IFPLL 50 may, for example, upconvert (multiply) reference signal REF1 up to the frequency of clock signal IFLO (intermediate frequency $f_{IF}$ of FIG. 1) and may output the upconverted reference signal as clock signal IFLO.

On the other hand, when switch 72 is in the second switch state (e.g., when input terminal 78 is coupled to output terminal 76), IFPLL 50 may generate clock signal IFLO based on the reference signal REF2 output by REFPLL 82. IFPLL 50 may, for example, upconvert (multiply) reference signal REF2 up to intermediate frequency $f_{IF}$ (FIG. 1) and may output the upconverted reference signal as clock signal IFLO. Since REFPLL 82 generates reference signal REF2 based on reference signal REF1, IFPLL 50 still generates clock signal IFLO based on reference signal REF1 when switch 72 is in the second switch state, but only after further processing by REFPLL 82 and optionally a reduction in frequency via divider 74.

Control circuitry 14 may provide control signals CTRL to control inputs of IFPLL 50. RFPLL 52, and/or REFPLL 82 over control path 58 to switch IFPLL 50, RFPLL 52, and/or REFPLL 82 between the HSI mode and the LSI mode. Control signals CTRL may, for example, change the frequency of the PLL(s), switch a signal divider or multiplier at the output(s) of the PLL(s) into or out of use, and/or adjust any other circuitry in the PLL(s) that define the frequency of the signal(s) output by the PLL(s).

Control circuitry 14 may control the state of switch 72 based on whether clocking circuitry 30 is clocking mixers 38 and 40 in the HSI mode or the LSI mode. To minimize phase noise, control circuitry 14 may place switch 72 in the second switch state when clocking circuitry 30 is in the HSI mode (e.g., when clock signal RFLO is at a higher frequency than radio-frequency signal RFSIG) and may place switch 72 in the first switch state when clocking circuitry 30 is in the LSI mode (e.g., when clock signal RFLO is at a lower frequency than radio-frequency signal RFSIG).

Since switch 72 is in the second switch state in the HSI mode, both IFPLL 50 and RFPLL 52 generate their respective clock signals by upconverting the same reference signal REF2 output by REFPLL 82. This may serve to fully (maximally) correlate the phase noise of the clock signal IFLO generated by IFPLL 50 with the phase noise of the clock signal RFLO generated by RFPLL 52 (e.g., clock signals IFLO and RFLO share the same phase noise from both reference oscillator 66 and REFPLL 82). In the HSI mode, mixer 40 injects clock signal RFLO at frequency $f_{RFLO} > f_{RF}$. The corresponding phase noise injected by mixer 40 is then reversed or canceled out by mixer 38 using clock signal IFLO (e.g., due to the high correlation between clock signals IFLO and RFLO).

On the other hand, in the LSI mode, mixer 40 injects clock signal RFLO at frequency $f_{RFLO} < f_{RF}$ (FIG. 2). As such, fully correlating phase noise between clock signals IFLO and RFLO would be more detrimental to the overall phase noise produced by clocking circuitry 30, because the correlated phase noise would sum to higher than if the clock signals were uncorrelated. To mitigate this issue, switch 72 may be placed in the first switch state in the LSI mode, causing IFPLL 50 to generate clock signal IFLO based on reference signal REF1 from reference oscillator 66 but not based on reference signal REF2 from REFPLL 82. In other words, in the LSI mode (when switch 72 is in the first switch state), IFPLL 50 and RFPLL 52 may generate their respective clock signals by upconverting different reference signals (reference signal REF2 for RFPLL 52 but reference signal REF1 for IFPLL 50). This may serve to minimize phase noise correlation between clock signals IFLO and RFLO such that, when the mixers perform upconversion or downconversion using LSI, the overall summed phase noise from both stages of conversion is less than had clock signals IFLO and RFLO been fully correlated. In this way, clocking circuitry 30 may dynamically adjust how clock signals IFLO and RFLO are generated to ensure that phase noise is minimized regardless of whether mixers 38 and 40 perform conversion using LSI or HSI.

Figure 4:
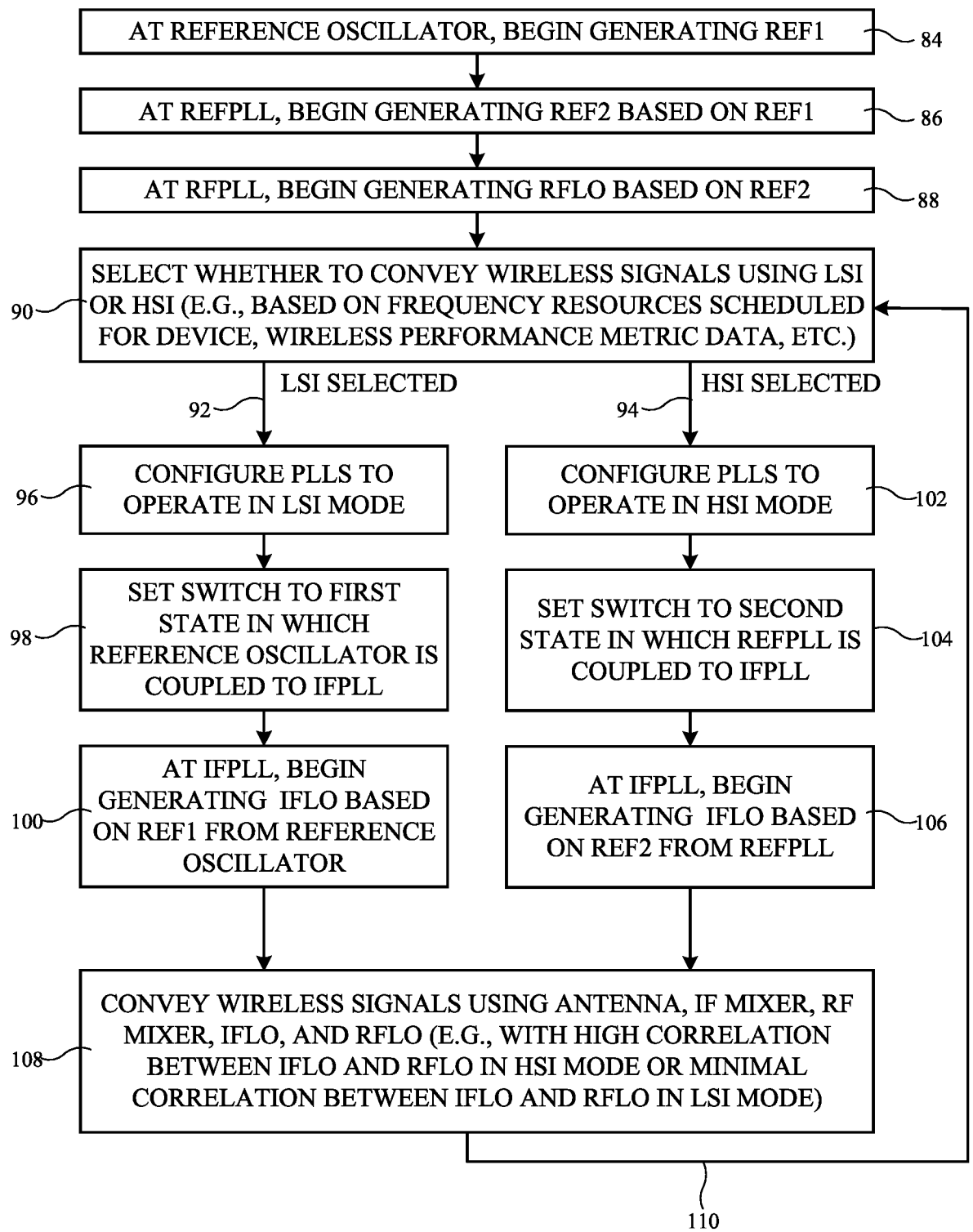
FIG. 4 is a flow chart of illustrative operations involved in conveying wireless signals using clocking circuitry of the type shown in FIG. 3 in accordance with some embodiments.

FIG. 4 is a flow chart of illustrative operations that may be performed by device 10 to convey radio-frequency signal RFSIG using clock circuitry 30 of FIG. 3 (e.g., in a manner that minimizes overall phase noise injection and thus maximizes communications performance).

At operation 84, reference oscillator 66 may begin generating reference signal REF1. Reference oscillator 66 may continue to generate reference signal REF1 concurrent with the remaining operations of FIG. 4.

At operation 86, REFPLL 82 may begin generating reference signal REF2 based on reference signal REF1 (e.g., by upconverting reference signal REF1). REFPLL 82 may continue to generate reference signal REF2 concurrent with the remaining operations of FIG. 4.

At operation 88, RFPLL 52 may begin generating RFLO based on reference signal REF2 (e.g., by upconverting reference signal REF2). RFPLL 52 may begin providing clock signal RFLO to mixer 40 for use in converting between intermediate frequency signal IFSIG and radio-frequency signal RFSIG. RFPLL 52 may continue to generate clock signal RFLO concurrent with the remaining operations of FIG. 4. While operations 84-90 are shown as separate operations in FIG. 4 for the sake of clarity, operation 90 may be performed concurrently with one or more of operations 84-88 if desired.

At operation 90, control circuitry 14 (FIG. 1) may select or otherwise identify whether to convey wireless signals (e.g., radio-frequency signal RFSIG) using LSI or HSI. Control circuitry 14 may, for example, select the injection mode for the mixer(s) in wireless circuitry 24 based on the frequency resources (e.g., frequency band) scheduled or assigned to device 10 by the corresponding communications network (e.g., the network associated with the base station that receives and/or transmits radio-frequency signal RFSIG). As another example, control circuitry 14 may select the injection mode to use based on wireless performance metric data gathered at device 10 (e.g., whichever of LSI or HSI would optimize wireless performance for device 10 given current or expected future operating conditions).

When control circuitry 90 selects the LSI mode, processing may proceed to operation 96 via path 92. At operation 96, control circuitry 14 may provide control signal CTRL to IFPLL 50, REFPLL 82, and/or RFPLL 52 over control path 58 (FIG. 3) to place the PLL(s) in the LSI mode.

At operation 98, control circuitry 14 may use control signal SEL to place switch 72 in the first switch state. This may couple input terminal 80 to output terminal 76 of switch 72 and may thereby couple reference oscillator 66 to IFPLL 50. IFPLL 50 may then begin receiving reference signal REF1 from reference oscillator 66 (through switch 72).

At operation 100, IFPLL 50 may begin generating clock signal IFLO based on reference signal REF1 (e.g., by upconverting reference signal REF1 to the frequency of clock signal IFLO). IFPLL 50 may begin providing clock signal IFLO to mixer 38 for use in converting between baseband signal BBSIG and intermediate frequency signal IFSIG. IFPLL 50 may continue to generate clock signal IFLO concurrent with the remaining operations of FIG. 4.

On the other hand, when control circuitry 90 selects the HSI mode, processing may proceed from operation 90 to operation 102 via path 94. At operation 102, control circuitry 14 may provide control signal CTRL to IFPLL 50, REFPLL 82, and/or RFPLL 52 over control path 58 (FIG. 3) that place the PLL(s) in the HSI mode.

At operation 104, control circuitry 14 may use control signal SEL to place switch 72 in the second switch state. This may couple input terminal 78 to output terminal 76 of switch 72 and may thereby couple REFPLL 82 to IFPLL 50. IFPLL 50 may then begin receiving reference signal REF2 from REFPLL 82 (through switch 72). If desired, divider 74 may reduce the frequency of reference signal REF2 prior to passing reference signal REF2 to switch 72.

At operation 106, IFPLL 50 may begin generating clock signal IFLO based on reference signal REF2 (e.g., by upconverting reference signal REF2 to the frequency of clock signal IFLO). IFPLL 50 may begin providing clock signal IFLO to mixer 38 for use in converting between baseband signal BBSIG and intermediate frequency signal IFSIG. IFPLL 50 may continue to generate clock signal IFLO concurrent with the remaining operations of FIG. 4.

At operation 108, wireless circuitry 24 may convey wireless signals using antenna 34, mixer 40 (as clocked using clock signal RFLO), and mixer 38 (as clocked using clock signal IFLO). In the HSI mode, the high correlation between clock signals IFLO and RFLO may cause phase noise to be canceled via the dual conversion performed by mixers 38 and 40. On the other hand, in the LSI mode, the low correlation between clock signals IFLO and RFLO may serve to reduce phase noise introduced by mixers 38 and 40 relative to when there is high correlation between clock signals IFLO and RFLO. Processing may loop back to operation 90 via path 110 as the injection mode is updated over time.

As used herein, the term "concurrent" means at least partially overlapping in time. In other words, first and second events are referred to herein as being "concurrent" with each other if at least some of the first event occurs at the same time as at least some of the second event (e.g., if at least some of the first event occurs during, while, or when at least some of the second event occurs). First and second events can be concurrent if the first and second events are simultaneous (e.g., if the entire duration of the first event overlaps the entire duration of the second event in time) but can also be concurrent if the first and second events are non-simultaneous (e.g., if the first event starts before or after the start of the second event, if the first event ends before or after the end of the second event, or if the first and second events are partially non-overlapping in time). For example, switch 72 may be in the first switch state concurrent with clocking circuitry 30 being in the LSI mode and may be in the second switch state concurrent with clocking circuitry 30 being in the HSI mode. As used herein, the term "while" is synonymous with "concurrent."

Device 10 may gather and/or use personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The methods and operations described above in connection with FIGS. 1-4 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry 18 of FIG. 1, etc.). The processing circuitry may include microprocessors, central processing units (CPUs), application-specific integrated circuits with processing circuitry, or other processing circuitry.

The foregoing is merely illustrative and various modifications can be made to the described embodiments. The foregoing embodiments may be implemented individually or in any combination.

What is claimed is:

1. An electronic device comprising:
   an antenna;
   a first mixer communicatively coupled to the antenna and configured to convert a signal between a first frequency and a second frequency based on a first clock signal;
   a second mixer communicatively coupled between the first mixer and the antenna and configured to convert the signal between the second frequency and a third frequency based on a second clock signal at a higher frequency than the first clock signal;
   a reference oscillator;
   a first phase-locked loop (PLL) having an input coupled to an output of the reference oscillator;
   a second PLL having an input coupled to an output of the first PLL and configured to generate the second clock signal;
   a third PLL configured to generate the first clock signal; and
   a switch having a first terminal coupled to the output of the reference oscillator, a second terminal coupled to the output of the first PLL, and a third terminal coupled to an input of the third PLL.

2. The electronic device of claim 1, wherein the second PLL is switchable between a high side injection mode and a low side injection mode.

3. The electronic device of claim 2, wherein the switch is configured to couple the output of the first PLL to the input of the third PLL concurrent with the second PLL being in the high side injection mode.

4. The electronic device of claim 3, wherein the switch is configured to couple the output of the reference oscillator to the input of the third PLL concurrent with the second PLL being in the low side injection mode.

5. The electronic device of claim 4, further comprising:
one or more processors configured to switch the second PLL between the high side injection mode and the low side injection mode based on a frequency resource assigned to the electronic device.

6. The electronic device of claim 1, wherein the reference oscillator comprises a crystal oscillator or a micro-electro-mechanical systems (MEMS) oscillator.

7. The electronic device of claim 1, wherein the reference oscillator is configured to generate a third clock signal, the first PLL is configured to generate a fourth clock signal based on the third clock signal, and the second PLL is configured to generate the second clock signal based on the fourth clock signal.

8. The electronic device of claim 7, wherein the switch is switchable between a first state in which the first terminal is coupled to the third terminal and the second terminal is decoupled from the third terminal and a second state in which the second terminal is coupled to the third terminal and the first terminal is decoupled from the third terminal.

9. The electronic device of claim 8, wherein the third PLL is configured to generate the first clock signal based on the third clock signal while the switch is in the first state and is configured to generate the first clock signal based on the fourth clock signal while the switch is in the second state.

10. The electronic device of claim 9, further comprising:
one or more processors configured to place the switch in the first state concurrent with the second clock signal being at a lower frequency than the third frequency and configured to place the switch in the second state concurrent with the second clock signal being at a higher frequency than the third frequency.

11. The electronic device of claim 10, wherein the first frequency is a baseband frequency, the second frequency is higher than the baseband frequency, the third frequency is greater than or equal to 10 GHz, the third clock signal is at a fourth frequency less than or equal to 100 MHZ, and the fourth clock signal is at a fifth frequency greater than the fourth frequency.

12. The electronic device of claim 1, further comprising:
a frequency divider coupled between the output of the first PLL and the second terminal of the switch.

13. A wireless transceiver configured to convey a signal at a first frequency using an antenna, the wireless transceiver comprising:
a first mixer configured to convert the signal between the first frequency and a second frequency lower than the first frequency;
a second mixer configured to convert the signal between the second frequency and a third frequency lower than the second frequency;
a first phase-locked loop (PLL) having an output coupled to the first mixer;
a second PLL having an output coupled to the second mixer;
a third PLL having an output coupled to an input of the first PLL; and
a switch coupled between the output of the third PLL and an input of the second PLL, the switch having a state that is based on an injection mode of the first mixer.

14. The wireless transceiver of claim 13, wherein the mixer is configured to convert the first-signal in a high side injection (HSI) mode or a low side injection (LSI) mode, the switch is configured to couple the output of the third PLL to the input of the second PLL concurrent with the first mixer converting the signal in the HSI mode, and the switch is configured to decouple the output of the third PLL from the input of the second PLL concurrent with the first mixer converting the first signal in the LSI mode.

15. The wireless transceiver of claim 13, further comprising:
a reference oscillator having an output coupled to the switch and an input of the third PLL, wherein the switch has a first state in which the switch couples the output of the reference oscillator to the input of the second PLL and a second state in which the switch couples the output of the third PLL to the input of the second PLL.

16. The wireless transceiver of claim 13, further comprising:
a frequency divider coupled between the switch and the output of the third PLL.

17. The wireless transceiver of claim 13, wherein:
the mixer is configured to convert the signal in a high side injection (HIS) mode or a low side injection (LSI) mode, and
the switch is configured to decouple the output of the third PLL from the input of the second PLL concurrent with the first mixer converting the signal in the LSI mode.

18. A method of operating circuitry, the method comprising:
generating, using a reference oscillator, a first clock signal;
upconverting, using a first phase-locked loop (PLL), the first clock signal to produce a second clock signal;
upconverting, using a second PLL, the second clock signal to produce a third clock signal;
mixing, using a first mixer, a first signal with the third clock signal, the third clock signal being higher in frequency than the first signal;
upconverting, using a third PLL, the second clock signal to produce a fourth clock signal lower in frequency than the third clock signal;
coupling, using a switch, an input of the third PLL to an output of the reference oscillator or an output of the first PLL; and
mixing, using a second mixer, the signal with the fourth clock signal.

19. The method of claim 18, further comprising:
upconverting, using the second PLL, the second clock signal to produce a fifth clock signal lower in frequency than the first signal;
mixing, using the first mixer, a second signal with the fifth clock signal;
upconverting, using the third PLL, the first clock signal to produce a sixth clock signal lower in frequency than the fifth clock signal; and
mixing, using the second mixer, the second signal with the sixth clock signal.

20. The method of claim 19, further comprising:
toggling, using one or more processors, the switch between production of the fourth clock signal and the fifth clock signal by the third PLL, the switch having a first input terminal coupled to an output of the reference oscillator, a second input terminal coupled to an output of the first PLL, and an output terminal coupled to an input of the third PLL.

* * * * *

UNITED STATES PATENT AND TRADEMARK OFFICE
CERTIFICATE OF CORRECTION

| | | |
|---|---|---|
| PATENT NO. | : 12,431,908 B2 | Page 1 of 1 |
| APPLICATION NO. | : 18/312393 | |
| DATED | : September 30, 2025 | |
| INVENTOR(S) | : Thomas Mayer et al. | |

It is certified that error appears in the above-identified patent and that said Letters Patent is hereby corrected as shown below:

On the Title Page

Right Column, Item (57), Line 13, "to may minimize" should read -- to minimize --

In the Claims

Column 17, Line 62, "the first-signal" should read -- the signal --

Column 18, Line 5, "the first signal" should read -- the signal --

Column 18, Line 21, "(HIS)" should read -- (HSI) --

Signed and Sealed this
Thirtieth Day of December, 2025

John A. Squires
*Director of the United States Patent and Trademark Office*